(12) United States Patent
Lin

(10) Patent No.: US 12,021,158 B2
(45) Date of Patent: Jun. 25, 2024

(54) MASK-LAYER-FREE HYBRID PASSIVATION BACK CONTACT CELL AND FABRICATION METHOD THEREOF

(71) Applicant: Golden Solar (Quanzhou) New Energy Technology Co., Ltd., Quanzhou (CN)

(72) Inventor: Kairui Lin, Quanzhou (CN)

(73) Assignee: Golden Solar (Quanzhou) New Energy Technology Co., Ltd., Quanzhou (CN)

( * ) Notice: Subject to any disclaimer, the term of this patent is extended or adjusted under 35 U.S.C. 154(b) by 0 days.

(21) Appl. No.: 18/120,578

(22) Filed: Mar. 13, 2023

(65) Prior Publication Data
US 2024/0120424 A1    Apr. 11, 2024

(30) Foreign Application Priority Data
Oct. 11, 2022    (CN) .......................... 202211237896.6

(51) Int. Cl.
*H01L 31/0224*    (2006.01)
*H01L 31/0216*    (2014.01)
(Continued)

(52) U.S. Cl.
CPC ............ *H01L 31/022441* (2013.01); *H01L 31/02168* (2013.01); *H01L 31/02366* (2013.01);
(Continued)

(58) Field of Classification Search
CPC ....... H01L 31/022441; H01L 31/02168; H01L 31/02366; H01L 31/028; H01L 31/03685;
(Continued)

(56) References Cited

U.S. PATENT DOCUMENTS 6,878,646 B1 *   4/2005   Tsai .................. H01L 21/32139
                                                       257/E21.314
2004/0150096 A1 *  8/2004  Purushothaman .. H01L 23/3164
                                                       257/E21.705
(Continued)

FOREIGN PATENT DOCUMENTS

CN    106252457 A    12/2016
CN    112510105 A     3/2021
CN    114823967 A     7/2022

OTHER PUBLICATIONS

A. Tomasi et al., "Back-Contacted Silicon Heterojunction Solar Cells With Efficiency >21%," in IEEE Journal of Photovoltaics, vol. 4, No. 4, pp. 1046-1054, Jul. 2014, doi: 10.1109/JPHOTOV.2014.2320586 (Year: 2014).*

(Continued)

*Primary Examiner* — Sitaramarao S Yechuri
(74) *Attorney, Agent, or Firm* — Erise IP, P.A.

(57) ABSTRACT

The present disclosure pertains to the field of back contact heterojunction cell technologies, and particularly relates to a mask-layer-free hybrid passivation back contact cell and a fabrication method thereof; the method includes: S101: providing a silicon wafer substrate; S102: sequentially forming a first semiconductor layer and a mask layer on a back surface of the silicon wafer substrate, wherein the first semiconductor layer includes a tunneling oxide layer and a first doped polycrystalline layer; S103: performing first etching on the first semiconductor layer on the obtained back surface to form first opening regions $W_1$; S104: forming a textured surface in the first opening region $W_1$ on the back surface by texturing and cleaning; S105: removing the mask layer; S106: forming a second semiconductor layer on the obtained back surface; and S107: performing second etching on a polished region of the obtained back surface.

13 Claims, 5 Drawing Sheets

(51) Int. Cl.
| | |
|---|---|
| *H01L 31/0236* | (2006.01) |
| *H01L 31/028* | (2006.01) |
| *H01L 31/0368* | (2006.01) |
| *H01L 31/0376* | (2006.01) |
| *H01L 31/077* | (2012.01) |
| *H01L 31/18* | (2006.01) |

(52) U.S. Cl.
CPC ...... *H01L 31/028* (2013.01); *H01L 31/03685* (2013.01); *H01L 31/03762* (2013.01); *H01L 31/077* (2013.01); *H01L 31/1824* (2013.01)

(58) Field of Classification Search
CPC ............. H01L 31/03762; H01L 31/077; H01L 31/1824

See application file for complete search history.

(56) References Cited

U.S. PATENT DOCUMENTS

| | | | |
|---|---|---|---|
| 2010/0148301 A1* | 6/2010 | Matsuda | ........... C23C 16/45525 |
| | | | 257/E21.546 |
| 2012/0305063 A1* | 12/2012 | Moslehi | .............. H01L 31/0682 |
| | | | 257/E31.124 |
| 2014/0020742 A1 | 1/2014 | Hasegawa et al. | |
| 2014/0295613 A1 | 10/2014 | O'Sullivan | |
| 2018/0337292 A1* | 11/2018 | Lee | ..................... H01L 31/0747 |
| 2020/0091366 A1* | 3/2020 | Swanson | ......... H01L 31/022441 |

OTHER PUBLICATIONS

Chinese Patent Application No. 2022112378966 Search Report dated Nov. 6, 2022.
Chinese Patent Application No. 2022112378966 Office Action dated Nov. 15, 2022.

\* cited by examiner

MASK-LAYER-FREE HYBRID PASSIVATION BACK CONTACT CELL AND FABRICATION METHOD THEREOF

RELATED APPLICATION

The present disclosure claims priority of Chinese patent application with the filing number 2022112378966 filed on Oct. 11, 2022, with the Chinese Patent Office, and entitled "MASK-LAYER-FREE HYBRID PASSIVATION BACK CONTACT CELL AND FABRICATION METHOD THEREOF", the contents of which are incorporated herein by reference in entirety.

TECHNICAL FIELD

The present disclosure pertains to the field of back contact heterojunction cell technologies, and particularly relates to a mask-layer-free hybrid passivation back contact cell and a fabrication method thereof.

BACKGROUND ART

A current technological process of a back contact heterojunction cell generally includes: S101: polishing two surfaces of a silicon wafer; S102: plating a first mask layer on a back surface of the silicon wafer for protection, wherein the first mask layer is made of at least one of silicon nitride, silicon oxynitride and silicon oxide; S103: texturing and cleaning the silicon wafer to form a textured surface on an opposite surface of the first mask layer, and then removing the first mask layer to form a silicon wafer having a structure with one textured surface and one polished surface; S104: sequentially plating a first semiconductor layer and a second mask layer on the back surface of the silicon wafer, wherein the first semiconductor layer includes an intrinsic amorphous or microcrystalline silicon layer and an N-type or P-type doped amorphous or microcrystalline silicon layer, and the second mask layer is generally made of silicon nitride; S105: etching an opening on the back surface of the silicon wafer, and removing the second mask layer and part of the first semiconductor layer to form an opening of second semiconductor region; S106: cleaning the silicon wafer to remove the first semiconductor layer in a second semiconductor region; S107: sequentially forming an amorphous layer and an anti-reflective layer on a light receiving surface of the silicon wafer, and forming a second semiconductor layer on the back surface, wherein the second semiconductor layer is formed in a PECVD or Hot-wire mode and includes an intrinsic amorphous or microcrystalline silicon layer and a P-type or N-type doped amorphous or microcrystalline silicon layer (when the first semiconductor layer is N-type, the second semiconductor layer is P-type, and when the first semiconductor layer is P-type, the second semiconductor layer is N-type); S108: etching openings on the back surface of the silicon wafer to form first semiconductor regions, wherein the first semiconductor regions and the second semiconductor regions are alternately arranged; S109: cleaning the silicon wafer to remove the second mask layer in the first semiconductor region; S110: depositing a conductive film on the back surface of the silicon wafer; S111: forming an insulation groove between the first semiconductor region and the second semiconductor region by etching; and S112: forming metal electrodes on the first semiconductor region and the second semiconductor region of the silicon wafer.

In a prior art, a back contact heterojunction solar cell generally has a structure with a textured light receiving surface and a polished back surface, a silicon wafer with such a structure is generally formed by firstly texturing double surfaces, then protecting one surface and then performing polishing or firstly polishing double surfaces, then protecting one surface and then performing texturing, such that the fabrication process is quite complicated. Moreover, too strong alkali liquor cannot be used for cleaning after a second semiconductor opening is formed, for the concern of the first semiconductor layer being prone to damage.

In the above step S107 of the prior art, in the process of forming the second semiconductor layer on the back surface, adhesion between the silicon nitride of the second mask layer and the second semiconductor layer is poor, and in the process step after step S107, there exists a delamination phenomenon between the second semiconductor layer and the second mask layer, which results in a reduction in a production yield and long term reliability.

SUMMARY

An object of the present disclosure is to provide a mask-layer-free hybrid passivation back contact cell and a fabrication method thereof, so as to overcome a defect in a prior art that there exists a delamination phenomenon between a second semiconductor layer and a second mask layer, which results in a reduction in a production yield and product reliability. The method is a texturing-last method, and the second semiconductor layer is directly formed on a surface of a first semiconductor layer, such that adhesion is high, the above delamination phenomenon is avoided, and the production yield and product reliability are higher.

In order to achieve the above object, a first aspect of the present disclosure provides a fabrication method of a mask-layer-free hybrid passivation back contact cell, including:

S101: providing a silicon wafer substrate;

S102: sequentially forming a first semiconductor layer and a mask layer on a back surface of the silicon wafer substrate, wherein the first semiconductor layer includes a tunneling oxide layer and a first doped polycrystalline layer which are sequentially formed on the back surface;

S103: performing first etching on the first semiconductor layer on the back surface obtained in S102 to form first opening regions W1 distributed at intervals;

S104: forming a textured surface in the first opening region W1 on the back surface by texturing and cleaning;

S105: removing the mask layer;

S106: forming a second semiconductor layer on the back surface obtained in S105, wherein the second semiconductor layer includes an intrinsic amorphous silicon layer and a second doped silicon crystal layer which are sequentially formed on the back surface; and S107: performing second etching on a polished region of the back surface obtained in S106 to expose the first semiconductor layer and form second opening regions W2, wherein the second opening regions W2 and the first opening regions W1 are arranged at intervals, wherein one of the first doped polycrystalline layer and the second doped silicon crystal layer is N-type, and the other one of the first doped polycrystalline layer and the second doped silicon crystal layer is P-type.

In some preferred embodiments, S101 further includes: sequentially polishing and cleaning the silicon wafer substrate.

In some preferred embodiments, in S102, the tunneling oxide layer is formed by deposition using an LPCVD method, and deposition condition includes introduction of oxygen, a pressure of 100-1,000 Pa, a deposition temperature of 550-700° C. and a deposition time of 5-60 min.

In some preferred embodiments, in S102, a thickness of the mask layer is 30-110 nm, and the mask layer is a composite layer of silicon nitride and silicon oxynitride.

In some preferred embodiments, in S103, a depth of the first etching is from a surface of the mask layer to a position 3 μm below an upper surface of the silicon wafer substrate, and preferably, part of the first doped polycrystalline layer is etched away by the first etching.

In some preferred embodiments, in S103, the first etching is performed using a laser process, laser is green laser or ultraviolet laser, and a pulse width is less than 100 nanoseconds.

In some preferred embodiments, the fabrication method further includes: in S104, forming a textured surface on a light receiving surface of the silicon wafer substrate, and then sequentially forming a passivation layer and an optional anti-reflective layer on the light receiving surface.

In some preferred embodiments, in S104, the textured surface is a pyramid textured surface, and a width of a pyramid is 1-5 μm.

In some preferred embodiments, in S105, the process of removing the mask layer includes: etching with a hydrofluoric acid etching solution with solubility of 2-10% by volume ratio for 2-10 min.

In some preferred embodiments, in S107, the second etching is performed using a laser process, laser is green laser or ultraviolet laser, and a pulse width is less than 100 nanoseconds.

In some preferred embodiments, a width of W1 is 0.3-0.6 mm, a width of W2 is 0.1-0.2 mm, and a width of a separation region Wg between the second opening region W2 and the first opening region W1 is 0.1-0.3 mm.

In some preferred embodiments, in S102, a thickness of the tunneling oxide layer is 1.5-2.5 nm, and a thickness of the first doped polycrystalline layer is 50-300 nm, and more preferably 100-300 nm; in S106, a thickness of the intrinsic amorphous silicon layer is 5-15 nm, and a thickness of the second doped silicon crystal layer is 5-20 nm.

In some preferred embodiments, the fabrication method further includes:
S108: forming a conductive film layer on the back surface obtained in S107 in a full-covering mode;
S109: performing third etching on the conductive film layer on the back surface obtained in S108 located between the second opening region W2 and the first opening region W1, so as to form an insulation groove; and
S110: forming metal electrodes on the second opening region W2 and the first opening region W1 of the back surface obtained in S109, respectively.

More preferably, in S109, the third etching is performed using a laser technology, laser is ultraviolet laser, and a pulse width is less than 100 nanoseconds.

More preferably, in S109, a width of an opening region $W_1$ at the insulation groove is 0.03-0.1 mm.

A second aspect of the present disclosure provides a mask-layer-free hybrid passivation back contact cell, which is fabricated using the fabrication method in the first aspect; the mask-layer-free hybrid passivation back contact cell includes a silicon wafer substrate, a first semiconductor layer and a second semiconductor layer, wherein the first semiconductor layer and the second semiconductor layer are arranged on a back surface of the silicon wafer substrate; the back surface of the silicon wafer substrate has a first region where the first semiconductor layer is in direct contact with the silicon wafer substrate, a second region where the second semiconductor layer is in direct contact with the silicon wafer substrate, and an interim region between the first region and the second region, and the first semiconductor layer and the second semiconductor layer are in direct overlay in the interim region.

In some preferred embodiments, a width of the first region is 0.1-0.2 mm, a width of the second region is 0.3-0.6 mm, and a width of the interim region is 0.1-0.3 mm.

In some preferred embodiments, the first semiconductor layer includes a tunneling oxide layer and a first doped polycrystalline layer, the second semiconductor layer includes an intrinsic amorphous silicon layer and a second doped silicon crystal layer, wherein one of the first doped polycrystalline layer and the second doped silicon crystal layer is N-type, and the other one of the first doped polycrystalline layer and the second doped silicon crystal layer is P-type.

More preferably, a thickness of the tunneling oxide layer is 1.5-2.5 nm, and a thickness of the first doped polycrystalline layer is 50-300 nm.

More preferably, a thickness of the intrinsic amorphous silicon layer is 5-15 nm, and a thickness of the second doped silicon crystal layer is 5-20 nm.

More preferably, the second doped silicon crystal layer is at least one of a doped amorphous silicon layer or a doped microcrystalline silicon layer.

In some preferred embodiments, the mask-layer-free hybrid passivation back contact cell further includes:
a passivation layer and an optional anti-reflective layer sequentially arranged on a light receiving surface of the silicon wafer substrate, wherein the passivation layer comprises a passivation film layer and a doped film layer;
a conductive film layer provided on the back surface of the silicon wafer substrate, wherein the insulation groove is formed in the conductive film layer located in the interim region, wherein a width of the insulation groove is 0.03-0.1 mm; and
metal electrodes arranged in the first region and the second region respectively.

The present disclosure has the following beneficial effects.

In the present disclosure, a texturing-last process is adopted; specifically, the tunneling oxide layer and the first doped polycrystalline layer are adopted as the first semiconductor layer, texturing is performed after the first opening region W1 is formed, the mask layer is completely etched, and then, technical features, such as the second semiconductor layer, or the like, are formed, such that the second semiconductor layer is directly deposited on the first semiconductor layer without being deposited on the surface of the mask layer (such as a silicon nitride layer), thus greatly improving the adhesion of the second semiconductor layer, improving cleanliness of the surface of the silicon wafer substrate, improving the product yield and stability, and simplifying the technological process.

The first semiconductor layer in the present disclosure includes the tunneling oxide layer and the first doped polycrystalline layer. Compared with a conventionally adopted amorphous/microcrystalline layer, chemical resistance of the first semiconductor layer is remarkably enhanced, such that texturing can be realized after the first semiconductor layer is deposited, thus greatly improving a cleaningness of the surface of the silicon wafer substrate, and then improving stability of a cell fabrication process. Moreover, in the present disclosure, the tunneling oxide layer and the first doped polycrystalline layer are adopted as the first semiconductor layer. Compared with a conventionally adopted intrinsic amorphous silicon layer and doped amorphous/microcrystalline layer, resistivity of the first doped polycrystalline layer is significantly lower than that of the amorphous/microcrystalline layer. In addition, the tunneling oxide layer is used, such that the first semiconductor layer in the present disclosure is more beneficial to a big cut of electrical efficiency loss caused by transmission of carriers in an isolation region. Preferably, the first doped polycrystalline silicon layer is thickened to have a thickness of 50-300 nm, and can be prevented from being damaged by etching in the process of high-temperature-alkali-liquor texturing-last (for example, 80° C. and 10% KOH concentration) and cleaning; and the thickness of the amorphous layer conventionally adopted by the first semiconductor layer is small and is 5-15 nm, and conventional amorphous silicon is prone to damage by etching in the texturing-last process.

In the present disclosure, the mask layer is completely etched away after texturing, the second semiconductor layer is directly deposited on the surface of the first doped polycrystalline silicon layer of the first semiconductor layer, thus avoiding a problem that the adhesion is poor when the second doped silicon crystal layer is deposited on the surface of the mask layer.

BRIEF DESCRIPTION OF DRAWINGS

To describe the technical solutions in the embodiments of the present disclosure more clearly, the following briefly describes the accompanying drawings required in the embodiments. It should be understood that the following accompanying drawings show merely some embodiments of the present disclosure and therefore should not be considered as limiting the scope, and a person of ordinary skill in the art may still derive other related drawings from these accompanying drawings without creative efforts.

REFERENCE NUMERALS

10: silicon wafer, 11: tunneling oxide layer, 12: N-type doped polycrystalline layer, 12a: intrinsic polycrystalline layer, 12b: phosphorosilicate glass layer, 13: mask layer, 14i: passivation film layer, 14n: doped film layer, 15i: intrinsic amorphous layer, 15p: P-type doped amorphous layer, 16: anti-reflective layer, 17: conductive film layer, 17a: protecting ink, 18n: first metal electrode, and 18p: second metal electrode.

DETAILED DESCRIPTION OF EMBODIMENTS

Endpoints and any value of ranges disclosed herein are not limited to the precise ranges or values, and these ranges or values should be understood to encompass values close to these ranges or values. For numerical ranges, endpoint values of the ranges can be combined with each other, endpoint values of the ranges and individual point values can be combined with each other, and individual point values can be combined with each other, so as to obtain one or more new numerical ranges, and such numerical ranges should be construed as specifically disclosed herein.

In the present disclosure, solubility is measured by mass.

A first aspect of the present disclosure provides a fabrication method of a mask-layer-free hybrid passivation back contact cell, including:

S101: providing a silicon wafer substrate;

S102: sequentially forming a first semiconductor layer and a mask layer on a back surface of the silicon wafer substrate, wherein the first semiconductor layer includes a tunneling oxide layer and a first doped polycrystalline layer which are sequentially formed on the back surface;

S103: performing first etching on the first semiconductor layer on the back surface obtained in S102 to form first opening regions $W_1$ distributed at intervals;

S104: forming a textured surface in the first opening region $W_1$ on the back surface by texturing and cleaning;

S105: removing the mask layer;

S106: forming a second semiconductor layer on the back surface obtained in S105, wherein the second semiconductor layer includes an intrinsic amorphous silicon layer and a second doped silicon crystal layer which are sequentially formed on the back surface; and S107: performing second etching on a polished region of the back surface obtained in S106 to expose the first semiconductor layer and form second opening regions $W_2$, wherein the second opening regions and the first opening regions $W_1$ are arranged at intervals.

One of the first doped polycrystalline layer and the second doped silicon crystal layer is N-type, and the other one of the first doped polycrystalline layer and the second doped silicon crystal layer is P-type. It may be understood that when the first doped polycrystalline layer is an N-type doped polycrystalline layer, the second doped silicon crystal layer is a P-type doped silicon crystal layer. In this case, the first opening region is a P-type semiconductor opening region, and $W_1$ can be referred to as $W_p$; and the second opening region is an N-type semiconductor opening region, and $W_2$ may be referred to as $W_n$. When the first doped polycrystalline layer is a P-type doped polycrystalline layer, the second doped silicon crystal layer is an N-type doped silicon crystal layer; in this case, the first opening region is an N-type semiconductor opening region, and $W_1$ can be referred to as $W_n$; and the second opening region is a P-type semiconductor opening region, and $W_2$ may be referred to as $W_p$.

In the present disclosure, the silicon wafer substrate is an N-type silicon wafer, and can be a Czochralski monocrystalline silicon wafer or a cast monocrystalline silicon wafer.

In some preferred embodiments, S101 further includes: sequentially polishing and cleaning the silicon wafer substrate.

More preferably, the polishing is performed using a potassium hydroxide or sodium hydroxide solution having solubility of 3-8% by weight.

More preferably, a polishing temperature is 70-90° C.

Cleaning liquid used for the cleaning can be selected by those skilled in the art according to requirements, and may be, for example, an SC1 solution, an SC2 solution, an HF solution, or the like.

In some preferred embodiments, in S102, the tunneling oxide layer is formed by deposition using a low-pressure chemical vapor deposition (LPCVD) method, and deposition condition includes introduction of oxygen, a pressure of 100-1,000 Pa, a deposition temperature of 550-700° C. and a deposition time of 5-60 min. In some other preferred embodiments, in S102, the tunneling oxide layer is formed by a PECVD polycrystalline deposition apparatus, and condition thereof includes: a deposition temperature of 250-500° C., introduction of oxygen, a process vacuum degree of 100-500 Pa, and a deposition time of 10-100 seconds.

In S102, in a first embodiment, the process of forming a first doped polycrystalline layer includes: evacuating cleaning gas after depositing the tunneling oxide layer, depositing an intrinsic polycrystalline layer using an LPCVD method, then placing the obtained product in a diffusion furnace for diffusion and impurity absorption, converting the intrinsic polycrystalline layer into the first doped polycrystalline layer after diffusion, and meanwhile forming a phosphorosilicate glass layer on a surface of the first doped polycrystalline layer; and then removing the phosphorosilicate glass layer. More preferably, condition for depositing the intrinsic polycrystalline layer using the LPCVD method includes: introduction of silane, a pressure of 500-3,000 Pa, a deposition temperature of 550-700° C. and a deposition time of 5-60 min. More preferably, condition for the diffusion and impurity absorption includes: introduction of mixed gas including oxygen, nitrogen and phosphorus oxychloride, a pressure of 100-10,000 Pa, a diffusion temperature of 700-925° C., and a diffusion time of 10-100 min; a mass flow ratio of the oxygen, nitrogen with a large amount and nitrogen with a small amount carrying the phosphorus oxychloride in the mixed gas is 4-8:4-8:1. More preferably, hydrofluoric acid is used for removing the phosphorosilicate glass layer. The preferred solution of forming the first doped polycrystalline layer in the present disclosure can be compatible with an existing mature mass production apparatus process, and is more beneficial to mass production and rapid popularization.

In a second embodiment, the process of forming a first doped polycrystalline layer includes: adopting a PECVD polycrystalline deposition apparatus, and introducing mixed gas including silane, phosphine and hydrogen after depositing the tunneling oxide layer, wherein a deposition temperature is 250-500° C., and a deposition time is 100-1,000 seconds; a mass flow ratio of the silane, phosphine and hydrogen in the mixed gas is 1:1-2:1-10. Under the preferred solution, the tunneling oxide layer and the mask layer can be deposited in the same apparatus, which is more beneficial to a reduction of process steps, reduces an apparatus investment cost, and increases production yield.

In S102, the mask layer may be formed using the prior art, for example, a plasma enhanced chemical vapor deposition (PECVD) method, and a specific process includes: introducing gas including silane, ammonia and nitrous oxide in a mass flow ratio of 1:1-2:0.5-2, wherein a deposition temperature is 250-500° C., and a deposition time is 100-1,000 seconds.

In S102, preferably, a thickness of the mask layer is 30-110 nm.

Those skilled in the art can select a material of the mask layer according to actual requirements, as long as texturing can be blocked. Preferably, the mask layer is a composite layer of silicon nitride and silicon oxynitride, may be a mixed layer formed by mixing silicon nitride and silicon oxynitride, or may be a silicon nitride layer and a silicon oxynitride layer formed sequentially from bottom to top. Under the preferred solution, the mask layer in contact with the first doped polycrystalline layer is made of silicon oxynitride, and the silicon oxynitride can react with hydrofluoric acid more easily, which is beneficial to complete etching of the mask layer.

In S103, it can be understood that the first etching is performed to etch away the mask layer to the maximum extent and at least partially etch the first semiconductor layer, and the remaining part of the first semiconductor layer and a damage layer caused by the first etching (for example, laser) are etched away in the subsequent texturing in S104. In some preferred embodiments, in S103, a depth of the first etching is from a surface of the mask layer to a position 3 μm below an upper surface of the silicon wafer substrate, and preferably, part of the first doped polycrystalline layer is etched away by the first etching. The preferred solution can prevent the silicon wafer substrate from being damaged, and is more beneficial to a reduction of an etching amount of texturing.

In some preferred embodiments, in S103, the first etching is performed using a laser process, laser is green laser or ultraviolet laser, and a pulse width is less than 100 nanoseconds. The preferred solution can omit a mask layer etching process, and is more beneficial to simplification of the technological process.

In some preferred embodiments, the fabrication method further includes: in S104, forming a textured surface on a light receiving surface of the silicon wafer substrate, and then sequentially forming a passivation layer and an optional anti-reflective layer on the light receiving surface. The preferred solution is performed mainly to reduce reflection, increase a utilization rate of light, and increase a short-circuit current.

A shape of the textured surface can be selected by those skilled in the art according to requirements. In some preferred embodiments, in S104, the textured surface is a pyramid textured surface, and a width of a pyramid is 1-5 μm.

In some preferred embodiments, in S105, the process of removing the mask layer includes: etching with a hydrofluoric acid etching solution with solubility of 2-10% by volume ratio for 2-10 min. More preferably, the mask layer is removed by etching for 2-10 min using an etching solution with solubility of 4-10%. The preferred solution can ensure that the mask layer is completely etched, and is more beneficial to an improvement of the adhesion of the second semiconductor layer on the first semiconductor layer.

A specific type of the etching solution in the present disclosure is only required to etch away the mask layer, and the etching solution may be, for example, a hydrofluoric acid solution, or a BOE etching solution.

In S107, it may be understood that the second etching is performed to etch away the second semiconductor layer to expose the first semiconductor layer. In some preferred embodiments, in S107, the second etching is performed using a laser process, laser is green laser or ultraviolet laser, and a pulse width is less than 100 nanoseconds. The preferred solution can reduce damage of the laser to the first semiconductor layer, and is more beneficial to a reduction of passivation loss.

In some preferred embodiments, a width of $W_1$ is 0.3-0.6 mm, a width of $W_2$ is 0.1-0.2 mm, and a width of a separation region Wg between the second opening region $W_2$ and the first opening region $W_1$ is 0.1-0.3 mm. The preferred solution can balance transmission loss of carriers and feasibility of a manufacturing process, and is more beneficial to an improvement of a cell efficiency and the production yield.

In some preferred embodiments, in S102, a thickness of the tunneling oxide layer is 1.5-2.5 nm, and a thickness of the first doped polycrystalline layer is 50-300 nm, and more preferably 100-300 nm; in S106, a thickness of the intrinsic amorphous silicon layer is 5-15 nm, and a thickness of the second doped silicon crystal layer is 5-20 nm. Under the preferred solution, the thickness of each layer is proper, and especially, the first doped polycrystalline layer has an increased thickness, and thus can be prevented from being damaged by etching in the process of high-temperature-alkali-liquor texturing-last (for example, a 80° C. KOH solution with a concentration of 10 wt %) and cleaning; the tunneling oxide layer can be prevented from being damaged in the second etching, and a passivation quality can be maintained, thereby more facilitating shortening of a process period and an improvement of the production yield.

In some preferred embodiments, the fabrication method further includes:

S108: forming a conductive film layer on the back surface obtained in S107 in a full-covering mode;

S109: performing third etching on the conductive film layer on the back surface obtained in S108 located between the second opening region $W_2$ and the first opening region $W_1$, so as to form an insulation groove; and S110: forming metal electrodes on the second opening region $W_2$ and the first opening region $W_1$ of the back surface obtained in S109, respectively.

In S108, those skilled in the art may select a forming method and a composition of the conductive film layer according to a requirement, and exemplarily, the conductive film layer is made of indium tin oxide ITO. Exemplarily, the conductive film layer may be formed by a physical vapor deposition technology.

It may be understood that, in S109, the third etching is performed to etch away part of the conductive film layer. In some more preferred embodiments, the third etching is performed using a laser technology, laser is ultraviolet laser, and a pulse width is less than 100 nanoseconds. The preferred solution can simplify the technological process and is more beneficial to a reduction of apparatus investment and the improvement of the production yield.

In some other embodiments, the third etching process includes: forming an insulation groove mask pattern exposing a region required to form an insulation groove on the back surface by printing protecting ink, then etching the exposed conductive film layer using an etching solution to form the insulation groove, and then removing the protecting ink using an alkaline solution. The preferred solution can avoid damage to the first semiconductor layer by laser engraving and is more beneficial to maintaining of the passivation quality.

More preferably, in S109, a width of an opening region $W_1$ at the insulation groove is 0.03-0.1 mm. The preferred solution can balance feasibility of an apparatus and process, and is more beneficial to the improvement of the cell efficiency and the production yield.

In S110, the metal electrode may be formed using a silver paste printing technology or a copper grid line plating technology. It may be appreciated that the two metal electrodes are arranged on the back surface at intervals.

A second aspect of the present disclosure provides a mask-layer-free hybrid passivation back contact cell, which is fabricated using the fabrication method in the first aspect.

The mask-layer-free hybrid passivation back contact cell includes a silicon wafer substrate, a first semiconductor layer and a second semiconductor layer, wherein the first semiconductor layer and the second semiconductor layer are arranged on a back surface of the silicon wafer substrate; the back surface of the silicon wafer substrate has a first region where the first semiconductor layer is in direct contact with the silicon wafer substrate, a second region where the second semiconductor layer is in direct contact with the silicon wafer substrate, and an interim region between the first region and the second region, and the first semiconductor layer and the second semiconductor layer are in direct overlay in the interim region. In the present disclosure, contact between adjacent film layers on the second region is textured surface contact, and contact between adjacent film layers on the first region is flat surface contact.

In the mask-layer-free hybrid passivation back contact cell according to the present disclosure, the second semiconductor layer is directly arranged on the surface of the first doped polycrystalline silicon layer of the first semiconductor layer, thus avoiding the problem of poor adhesion of the second doped silicon crystal layer deposited on the surface of the mask layer, greatly improving the adhesion of the second semiconductor layer, improving cleanliness of the surface of the silicon wafer substrate, improving the product yield and stability, and simplifying the technological process.

In some preferred embodiments, a width of the first region is 0.1-0.2 mm, a width of the second region is 0.3-0.6 mm, and a width of the interim region is 0.1-0.3 mm.

In some preferred embodiments, the first semiconductor layer includes a tunneling oxide layer and a first doped polycrystalline layer, the second semiconductor layer includes an intrinsic amorphous silicon layer and a second doped silicon crystal layer, one of the first doped polycrystalline layer and the second doped silicon crystal layer is N-type, and the other one of the first doped polycrystalline layer and the second doped silicon crystal layer is P-type.

More preferably, a thickness of the tunneling oxide layer is 1.5-2.5 nm, and a thickness of the first doped polycrystalline layer is 50-300 nm. The preferred solution can balance effects of passivation and carrier tunneling, and is more beneficial to an improvement of the passivation quality and compatibility of a subsequent laser etching amount.

More preferably, a thickness of the intrinsic amorphous silicon layer is 5-15 nm, and a thickness of the second doped silicon crystal layer is 5-20 nm. The preferred solution can balance passivation and carrier transmission power loss, and is more beneficial to an improvement of the cell efficiency.

More preferably, the second doped silicon crystal layer is at least one of a doped amorphous silicon layer or a doped microcrystalline silicon layer.

In some preferred embodiments, the mask-layer-free hybrid passivation back contact cell further includes:
- a passivation layer and an optional anti-reflective layer sequentially arranged on a light receiving surface of the silicon wafer substrate;
- a conductive film layer provided on the back surface of the silicon wafer substrate, wherein the insulation groove is formed in the conductive film layer located in the interim region; and
- metal electrodes arranged in the first region and the second region, respectively.

Preferably, the passivation layer includes a passivation film layer and a doped film layer. The preferred solution can balance passivation and light absorption by the doped film layer, and is more beneficial to the improvement of the cell efficiency.

When the textured surface is formed on the light receiving surface of the silicon wafer substrate in S104 in the present disclosure, thicknesses of the passivation film layer, the doped film layer and the anti-reflective layer in a deposition plane are 1.3-1.4 times actual deposition thicknesses of the corresponding layers on textured surface. Exemplarily, when the thickness of the doped film layer on the deposition plane is 8-16 nm, the thickness of the doped film layer on the textured surface is 5-12 nm. Exemplarily, when the thickness of the passivation film layer on the deposition plane is 5-10 nm, the thickness of the passivation film layer on the textured surface is 3-8 nm. Exemplarily, when the thickness of the anti-reflective layer on the deposition plane is 80-140 nm, the thickness of the anti-reflective layer on the textured surface is 50-100 nm.

The composition of the anti-reflective layer can be selected by those skilled in the art according to requirements, and exemplarily, the anti-reflective layer in the present disclosure can be a composite layer of silicon nitride and silicon oxynitride.

Preferably, a thickness of the conductive film layer is 50-130 nm.

Preferably, a width of the insulation groove is 0.03-0.1 mm.

The present disclosure will be described below in further detail in conjunction with specific examples.

Example 1

A fabrication method of a mask-layer-free hybrid passivation back contact cell included following steps.

Figure 1A:
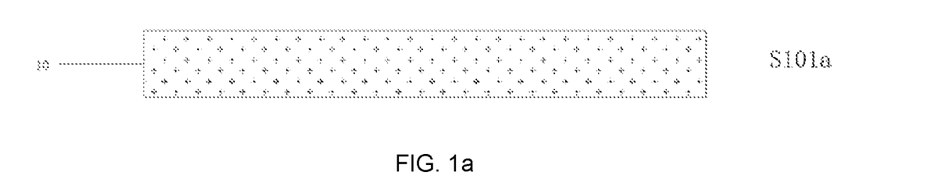
FIG. 1a is a schematic structural diagram of a silicon wafer after polishing and cleaning according to Example 1 of the present disclosure.

S101: as shown in FIG. 1a, providing a polished and cleaned N-type monocrystalline silicon wafer 10 (silicon wafer for short).

Specifically, the silicon wafer 10 was polished with a potassium hydroxide solution having a temperature of 80° C. and a mass concentration of 5%, and thereafter, a surface of the silicon wafer 10 was cleaned with an SC1 solution, with the silicon wafer 10 being a Czochralski monocrystalline silicon wafer.

Figure 2A:
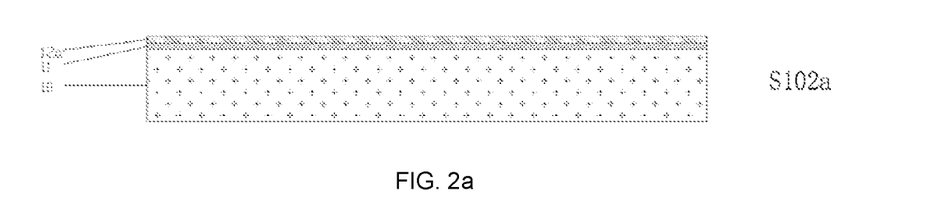
FIG. 2a is a schematic structural diagram in which a tunneling oxide layer and an intrinsic polycrystalline layer are formed on a back surface of the silicon wafer according to Example 1 of the present disclosure.
Figure 2B:
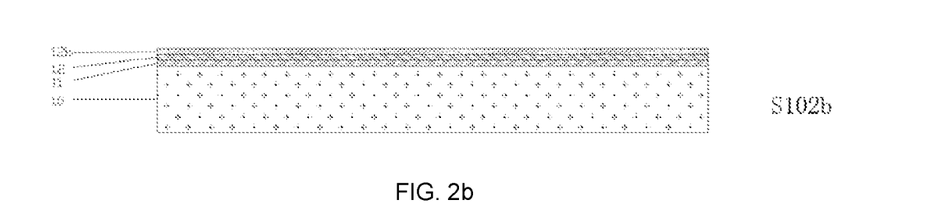
FIG. 2b is a schematic structural diagram in which an N-type doped polycrystalline layer and a phosphorosilicate glass (PSG) layer are formed on the back surface of the silicon wafer according to Example 1 of the present disclosure.
Figure 2C:
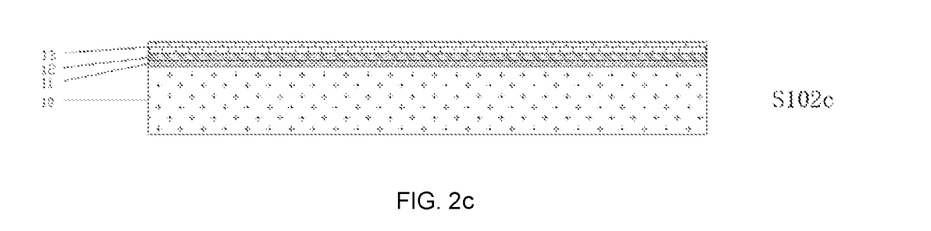
FIG. 2c is a schematic structural diagram in which a tunneling oxide layer, an N-type doped polycrystalline layer, and a mask layer are formed on the back surface of the silicon wafer indirectly or directly according to Example 1 or Example 2 of the present disclosure.

S102: as shown in FIGS. 2a, 2b and 2c, sequentially forming a tunneling oxide layer 11, an N-type doped polycrystalline layer 12, and a mask layer 13 on a back surface of the silicon wafer 10.

Specifically, as shown in FIG. 2a, a silicon oxide layer and an intrinsic polycrystalline layer 12a were formed on the back surface of the silicon wafer 10 using a LPCVD technology, with condition of LPCVD during deposition of the silicon oxide layer being as follows: oxygen was introduced, a pressure was 500 Pa, a deposition temperature was 600° C., a deposition time was 10 min, the silicon oxide layer had a thickness of 2 nm, and cleaning gas was evacuated after deposition of the silicon oxide layer; then, the intrinsic polycrystalline layer 12a was deposited, with condition of LPCVD during deposition of the intrinsic polycrystalline layer 12a being as follows: silane was introduced, a pressure was 1,000 Pa, a deposition temperature was 600° C., a deposition time was 10 min, and the intrinsic polycrystalline layer 12a had a thickness of 150 nm.

Then, as shown in FIG. 2b, the silicon wafer 10 was placed in a diffusion furnace for diffusion and impurity absorption, wherein process gas including nitrogen with a small amount carrying phosphorus oxychloride, oxygen and nitrogen with a large amount in a mass flow ratio of 1:5:5 was introduced, a pressure was 1,000 Pa, a diffusion temperature was 800° C., and a diffusion time was 20 min. The intrinsic polycrystalline layer 12a was converted into the N-type doped polycrystalline layer 12 after diffusion, and meanwhile, a phosphorosilicate glass layer 12b was formed on a surface of the N-type doped polycrystalline layer 12. A thickness of the N-type doped polycrystalline layer 12 was 150 nm.

As shown in FIG. 2c, the silicon wafer 10 was processed with hydrofluoric acid HF to remove the phosphorosilicate glass layer 12b on the surface of the silicon wafer 10, and then, the mask layer 13 was formed on the back surface of the silicon wafer 10 using a PECVD technology, and the mask layer 13 was a composite layer of silicon nitride and silicon oxynitride and had a thickness of 80 nm.

Figure 3:
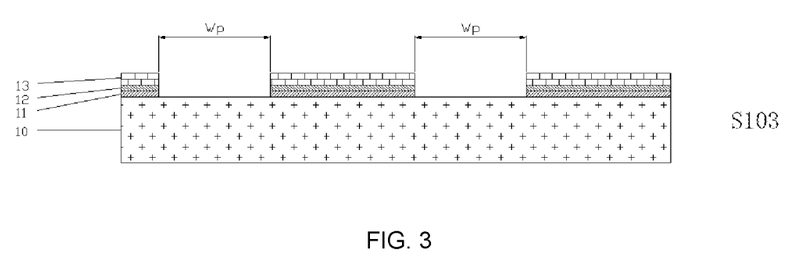
FIG. 3 is a schematic structural diagram in which a P-type semiconductor opening region is formed on the back surface of the silicon wafer according to Example 1 of the present disclosure.

S103: as shown in FIG. 3, etching the back surface of the silicon wafer 10 to form a P-type semiconductor opening region $W_p$.

Specifically, a laser process was adopted, laser was green laser, and a pulse width was 10 nanoseconds. The mask layer 13, the N-type doped polycrystalline layer 12 and the tunneling oxide layer 11 were directly etched away by the laser, a depth of the etching was from a surface of the mask layer 13 to a position 3 μm below an upper surface of the silicon wafer 10, and a width of the P-type semiconductor opening region $W_p$ was 0.5 mm.

Figure 4A:
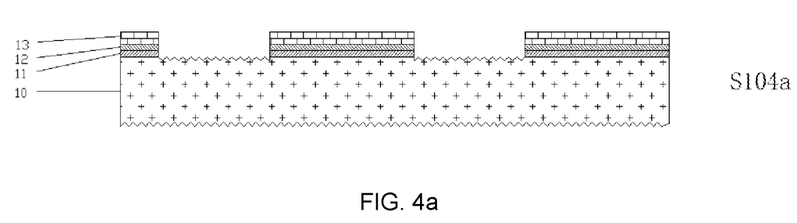
FIG. 4a is a schematic structural diagram in which a pyramid textured surface is formed on the P-type semiconductor opening region and a light receiving surface on the back surface of the silicon wafer by texturing and cleaning according to Example 1 of the present disclosure.
Figure 4B:
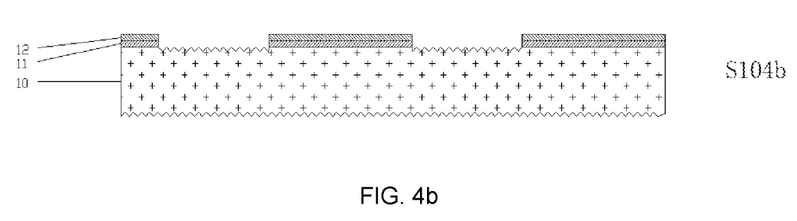
FIG. 4b is a schematic structural diagram in which the mask layer is removed on the back surface of the silicon wafer with an HF solution by etching and cleaning according to Example 1 of the present disclosure.

S104: as shown in FIG. 4a, by texturing and cleaning, forming pyramid textured surfaces on the P-type semiconductor opening region $W_p$ of the back surface of the silicon wafer 10 and the light receiving surface of the silicon wafer 10. As shown in FIG. 4b, the mask layer 13 was then removed by etching with a hydrofluoric acid solution having solubility of 5% for 2.5 min.

Figure 5:
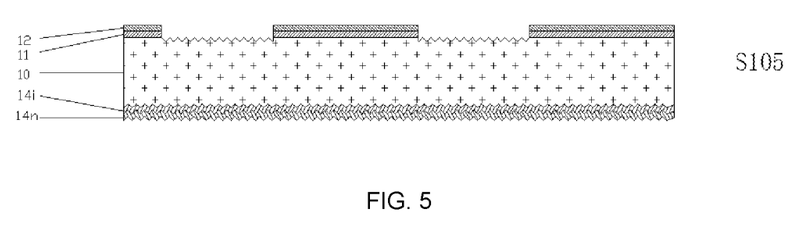
FIG. 5 is a schematic structural diagram in which a passivation layer is formed on the light receiving surface of the silicon wafer according to Example 1 of the present disclosure.

S105: as shown in FIG. 5, forming a passivation film layer 14i and a doped film layer 14n on the light receiving surface of the silicon wafer 10 by adopting a PECVD technology, with a thickness of the passivation film layer 14i being 6 nm, and a thickness of the doped film layer 14n being 10 nm.

Figure 6:
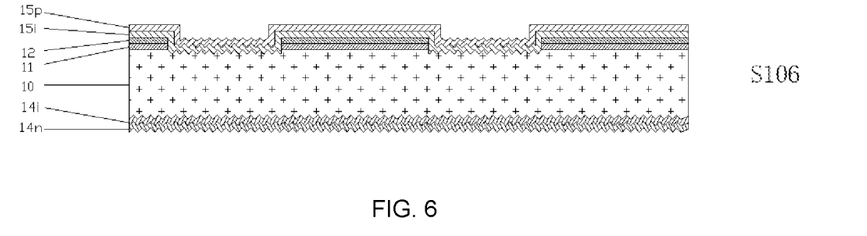
FIG. 6 is a schematic structural diagram in which an intrinsic amorphous layer and a P-type doped amorphous/microcrystalline layer are formed on the back surface of the silicon wafer according to Example 1 of the present disclosure.

S106: as shown in FIG. 6, forming an intrinsic amorphous layer 15i and a P-type doped amorphous layer 15p on the back surface of the silicon wafer 10 in a full-covering manner by using a PECVD technology, with a thickness of the intrinsic amorphous layer 15i being 10 nm, and a thickness of the P-type doped amorphous layer 15p being 10 nm.

Figure 7:
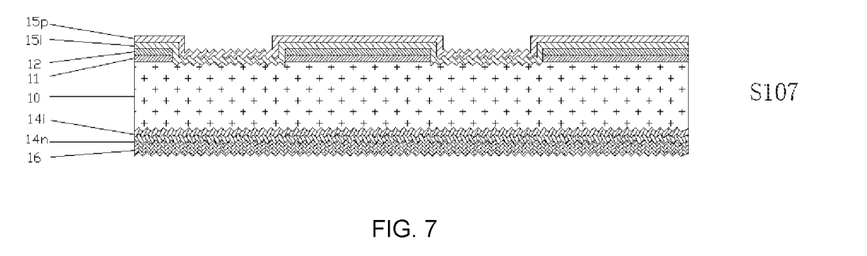
FIG. 7 is a schematic structural diagram in which an anti-reflective layer is formed on the light receiving surface of the silicon wafer according to Example 1 of the present disclosure.

S107: as shown in FIG. 7, forming an anti-reflective layer 16 on the light receiving surface of the silicon wafer 10 by adopting a PECVD technology, wherein the anti-reflective layer 16 was a composite layer of silicon nitride and silicon oxynitride, and a thickness of the anti-reflective layer 16 was 100 nm.

Figure 8:
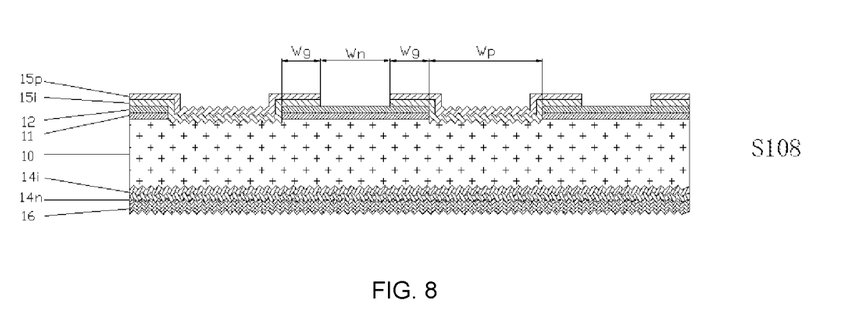
FIG. 8 is a schematic structural diagram in which N-type semiconductor opening regions are formed in a polished region on the back surface of the silicon wafer according to Example 1 of the present disclosure, the N-type semiconductor opening regions and the P-type semiconductor opening regions being arranged at intervals.

S108: as shown in FIG. 8, forming N-type semiconductor opening regions Wn in a polished region on the back surface of the silicon wafer 10 by adopting a laser technology, with the N-type semiconductor opening regions and the P-type semiconductor opening regions $W_p$ being arranged at intervals.

Specifically, the laser was green laser, a pulse width was 10 nanoseconds, the laser directly etched away the intrinsic amorphous layer 15i and the P-type doped amorphous layer 15P to form the N-type semiconductor opening region Wn and a separation region Wg between the N-type semiconductor region Wn and the P-type semiconductor region $W_p$, a width of the N-type semiconductor opening region Wn was 0.15 mm, and a width of the separation region Wg between the N-type semiconductor region and the P-type semiconductor region was 0.2 mm.

Figure 9:
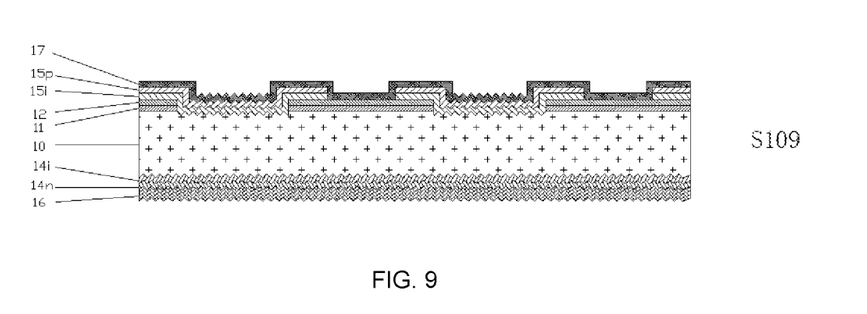
FIG. 9 is a schematic structural diagram in which a conductive film layer is formed on the back surface of the silicon wafer according to Example 1 of the present disclosure.

S109: as shown in FIG. 9, forming a conductive film layer 17 on the back surface of the silicon wafer 10 by adopting a physical vapor deposition technology, wherein the conductive film layer 17 was made of indium tin oxide (ITO) and had a thickness of 80 nm.

Figure 10A:
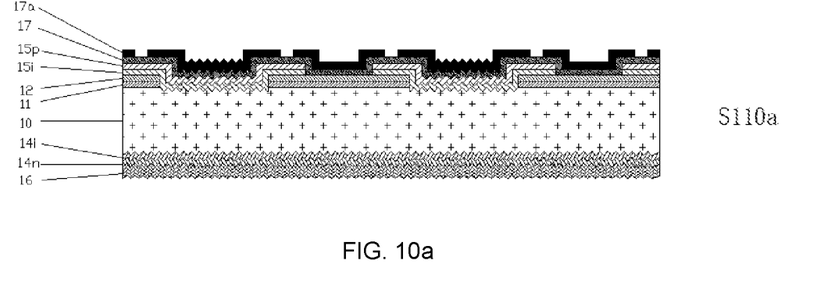
FIG. 10a is a schematic structural diagram in which an insulation groove pattern is formed between an N-type semiconductor opening region and a P-type semiconductor opening region on a back surface of a silicon wafer by performing masking by printing protecting ink according to Example 3 of the present disclosure.
Figure 10B:
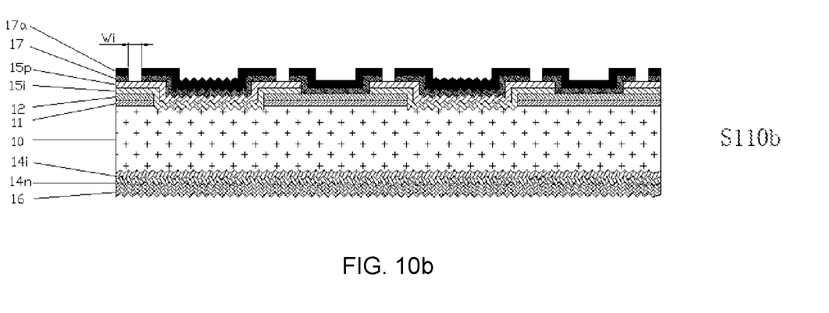
FIG. 10b is a schematic structural diagram in which the insulation groove pattern is etched using an etching solution to form an insulation groove according to Example 3 of the present disclosure.
Figure 10C:
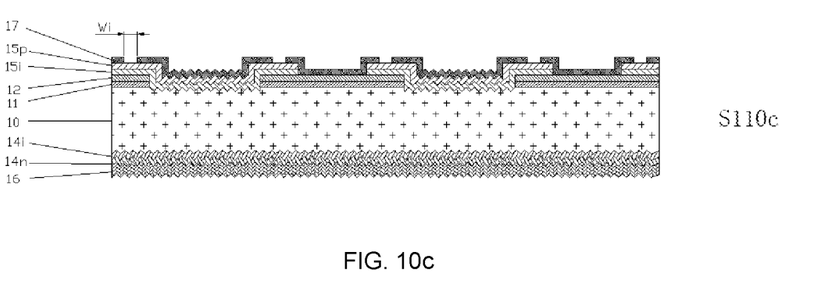
FIG. 10c is a schematic structural diagram in which the insulation groove is directly or indirectly formed between the N-type semiconductor opening region and the P-type semiconductor opening region on the back surface of the silicon wafer according to Example 1 or Example 3 of the present disclosure.

S110: as shown in FIG. 10c, forming an insulation groove $W_1$ between the N-type semiconductor opening region Wn and the P-type semiconductor opening region $W_p$ on the back surface of the silicon wafer 10 by adopting a laser technology, wherein the laser was ultraviolet laser, and a pulse width was less than 10 nanoseconds. The conductive film layer 17 in an insulation groove $W_1$ region was directly etched away by the laser, and a width of the opening region of the insulation groove $W_1$ was 0.06 mm.

Figure 11:
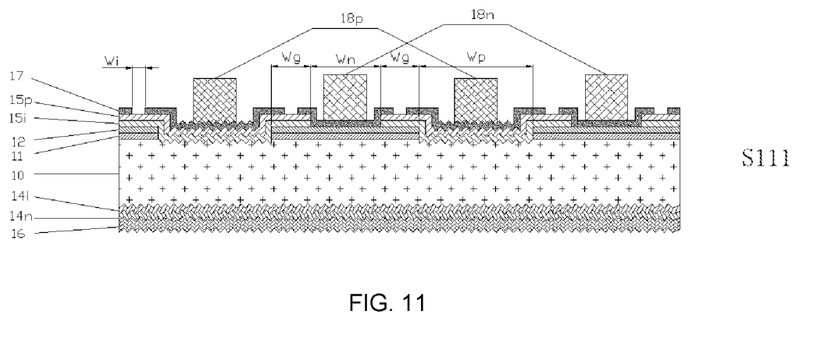
FIG. 11 is a schematic structural diagram in which two metal electrodes arranged at intervals are formed on the N-type semiconductor opening region and the P-type semiconductor opening region on the back surface of the silicon wafer according to Example 1 of the present disclosure.

S111: as shown in FIG. 11, forming a first metal electrode 18n and a second metal electrode 18p arranged at intervals at the N-type semiconductor opening region Wn and the P-type semiconductor opening region $W_p$ on the back surface of the silicon wafer 10 using a printing technology.

Example 2

The method according to this example was performed with reference to the method according to Example 1, except that a fabrication manner in S102 was different; as shown in FIG. 2c, a PECVD polycrystalline deposition apparatus was adopted to sequentially form a tunneling oxide layer 11, an N-type doped polycrystalline layer 12 and a mask layer 13 on the back surface of the silicon wafer 10, and the deposition temperature was 400° C.; when the tunneling oxide layer 11 was deposited, oxygen was introduced, the process vacuum degree was 300 Pa, and the deposition time was 20 s; when the N-type doped polycrystalline layer 12 was deposited, process gas including silane, phosphine and hydrogen in a mass flow ratio of 1:1:2 was introduced, and the deposition time was 200 seconds; when the mask layer 13 was deposited, process gas including silane, ammonia and nitrous oxide in a mass flow ratio of 1:1:0.5 was introduced, and the deposition time was 200 seconds.

Example 3

The method according to this example was performed with reference to the method according to Example 1, except that a fabrication manner in S110 was different; as shown in FIG. 10a, an insulation groove mask pattern was formed after printing protecting ink 17a was thermally cured, and as shown in FIG. 10b, an insulation groove Wi was formed in a mask pattern region with a hydrochloric acid etching solution, and then, the protecting ink 17a was removed by an alkaline solution, as shown in FIG. 10c.

Example 4

The method according to this example was performed with reference to the method according to Example 1, except that the mask layer 13 was removed by etching with a hydrofluoric acid solution having solubility of 2% for 2.5 min in S104.

Example 5

The method according to this example was performed with reference to the method according to Example 1, except that in S102, the thickness of the intrinsic polycrystalline layer 12a was 70 nm; that is, the thickness of the N-type doped polycrystalline layer 12 was 70 nm.

Comparative Example 1

The comparative example is a conventional back contact heterojunction solar cell, and a technological process was as follows:
S101: polishing two surfaces of a silicon wafer;
S102: plating a first mask layer on a back surface of the silicon wafer for protection, wherein the first mask layer was made of silicon nitride;
S103: texturing and cleaning the silicon wafer to form a pyramid textured surface on an opposite surface (i.e., the light receiving surface) of the first mask layer, and then removing the first mask layer to form a silicon wafer having a structure with one textured surface and one polished surface;
S104: sequentially plating a first semiconductor layer and a second mask layer on the back surface of the silicon wafer, wherein the first semiconductor layer was formed using a PECVD method, and included an intrinsic amorphous silicon layer and an N-type doped amorphous silicon layer, and the second mask layer was made of silicon nitride;
S105: etching an opening on the back surface of the silicon wafer, and removing the second mask layer and part of the first semiconductor layer to form a second semiconductor region opening;
S106: cleaning the silicon wafer to remove the first semiconductor layer in the second semiconductor region opening;
S107: sequentially forming an amorphous layer and an anti-reflective layer on the light receiving surface of the silicon wafer, and forming a second semiconductor layer on the back surface, wherein the second semiconductor layer was formed using a PECVD method and included an intrinsic amorphous silicon layer and a P-type doped amorphous silicon layer;
S108: etching openings on the back surface of the silicon wafer with laser to form first semiconductor region openings, wherein the first semiconductor region openings and the second semiconductor region openings were alternately arranged;
S109: cleaning the silicon wafer to remove the second mask layer in the first semiconductor region opening;
S110: depositing a conductive film on the back surface of the silicon wafer;
S111: forming an insulation groove between the first semiconductor region opening and the second semiconductor region opening by laser etching; and
S112: forming metal electrodes on the first semiconductor region opening and the second semiconductor region opening of the silicon wafer, respectively.

In the comparative example, a conventional texturing method was adopted for comparison with the texturing-last method according to Example 1. The comparative example was different from Example 1 in the process steps, and parameters, such as the thickness, or the like, of each layer were the same as those in Example 1.

Comparative Example 2

Figure 1B:
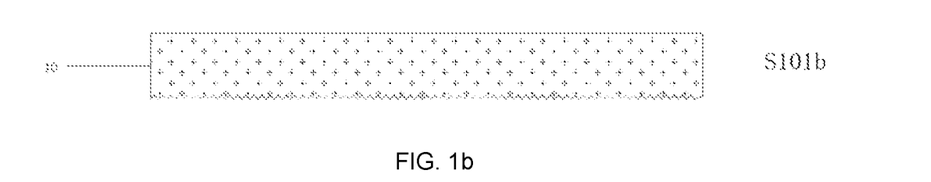
FIG. 1B is a schematic structural diagram of a silicon wafer with a textured front surface and a polished back surface according to Comparative Example 2 of the present disclosure.
Figure 12:
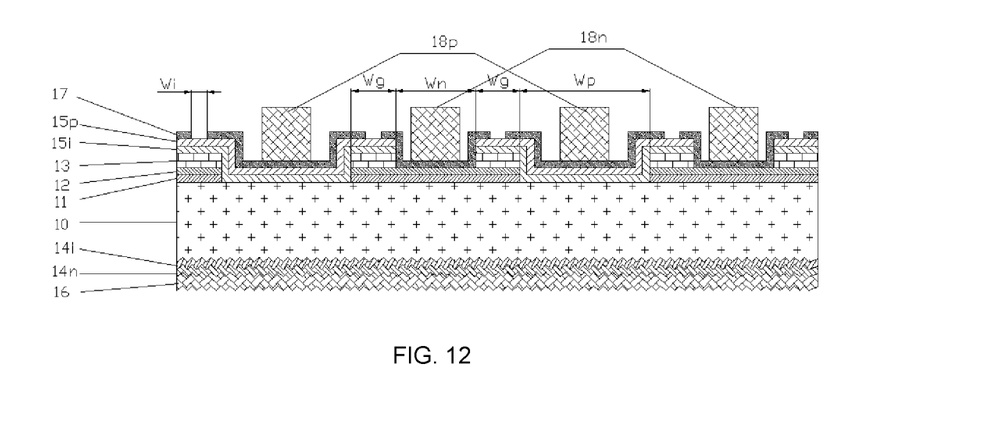
FIG. 12 is a schematic structural diagram of a hybrid passivation back contact cell with a mask layer according to Comparative Example 2.

The method according to this example was performed with reference to the method according to Example 1, except that the P-type semiconductor opening region was a polished surface, instead of a textured surface, as shown in FIG. 12 which was a schematic structural diagram of a cell in which conventional processes were matched with hybrid passivation and a mask layer was provided, and the texturing and removal of mask layer 13 of S104 were not performed; a different process step was as follows:
S101: as shown in FIG. 1B, providing an N-type monocrystalline silicon wafer 10 with a front textured surface and a back polished surface.

Specifically, the N-type monocrystalline silicon wafer with a front textured surface and a back polished surface can be formed by texturing two surfaces, then plating a mask layer on one surface for protection, and then performing polishing, or polishing two surfaces, then plating a mask layer on one surface for protection, and then performing texturing, and a width of a pyramid of the textured surface was 1-5 μm.

Etching and removal of the mask layer 13 in S104 were not performed.

Test Example

Back contact cells were fabricated according to the above examples and comparative examples, respectively. Different fabrication process index parameters were collected. The fabricated back contact cells were subjected to an IV test. Calculation was performed by taking 10,000 pieces as a unit, and the process period, yield and conversion efficiency in the process index parameters were extracted and compared. Results were shown in table 1 below.

TABLE 1

| Performance parameter | Process period (H) | Yield | Conversion efficiency |
| --- | --- | --- | --- |
| Example 1 | 18-30 | 100% | 100% |
| Example 2 | 15-27 | 99.5% | 100.1% |
| Example 3 | 19-31 | 99.2% | 100% |
| Example 4 | 18-30 | 99.5% | 99.8% |
| Example 5 | 18-30 | 99.2% | 99.5% |
| Example 4 | 20-32 | 99.5% | 100% |
| Comparative Example 1 | 24-36 | 97.5% | 100.1% |
| Comparative Example 2 | 22-34 | 99% | 99.5% |

It can be seen from the results in Table 1 that the back contact cell is manufactured by adopting mask-layer-free hybrid passivation in the present disclosure, such that the present disclosure may greatly shorten the process period, improve the production yield, is quite beneficial to the reduction of the apparatus investment, and is more suitable for mass production and popularization. It can be seen from Example 1 and Comparative Example 2 that the back contact cell is manufactured by adopting texturing-last mask-layer-free hybrid passivation in the present disclosure, such that the present disclosure may greatly shorten the process period and improve the production yield and a cell efficiency.

Further, it can be seen from Example 1 and Example 4 that the preferred solution for the solubility of hydrofluoric acid in the present disclosure is more beneficial to complete etching and removal of the mask layer, and avoids the problem of the poor adhesion caused by the deposition of the second doped crystalline silicon layer on the surface of the mask layer, such that the present disclosure is more beneficial to the improvement of the production yield and the conversion efficiency. It can be seen from Example 1 and Example 5 that the preferred solution of the N-type doped polycrystalline layer with a sufficient thickness in the present disclosure is more favorable for avoiding of damage to the tunneling oxide layer in the second laser etching in S107, so as to improve the production yield and the conversion efficiency.

The preferred embodiments of the present disclosure have been described in detail above, but the present disclosure is not limited thereto. Within the scope of the technical idea of the present disclosure, many simple modifications can be made to the technical solution of the present disclosure, including various technical features being combined in any other suitable way, and these simple modifications and combinations should also be regarded as the disclosure of the present disclosure, and all fall within the scope of the present disclosure.

What is claimed is:

1. A fabrication method of a mask-layer-free hybrid passivation back contact cell, comprising:
    providing a silicon wafer substrate having a back surface and a light receiving surface opposite the back surface;
    sequentially forming a first semiconductor layer and a mask layer on the back surface,
        wherein the first semiconductor layer comprises a tunneling oxide layer and a first doped polycrystalline layer which are sequentially formed on the back surface;
    performing first etching on the first semiconductor layer to form a plurality of first opening regions $W_1$ distributed at intervals;
    forming a first textured surface within each of the plurality of first opening regions $W_1$ on the back surface by texturing and cleaning;
    removing the mask layer from the back surface;
    forming a second semiconductor layer on the back surface,
        wherein the second semiconductor layer comprises an intrinsic amorphous silicon layer and a second doped silicon crystal layer which are sequentially formed on the back surface; and
    performing a second etching on a polished region of the back surface to expose the first semiconductor layer and form a plurality of second opening regions $W_2$,
        wherein the plurality of second opening regions $W_2$ and the plurality of first opening regions $W_1$ are arranged at intervals,
        wherein one of the first doped polycrystalline layer and the second doped silicon crystal layer is N-type, and the other one of the first doped polycrystalline layer and the second doped silicon crystal layer is P-type;
    the fabrication method further comprising:
    forming a conductive film layer on the back surface in a full-covering mode after forming the plurality of second opening regions;
    performing third etching on the conductive film layer on the back surface between the second opening regions $W_2$ and the first opening regions $W_1$, to form a plurality of insulation grooves Wi;
    forming metal electrodes on the plurality of second opening regions $W_2$ and the plurality of first opening regions $W_1$ of the back surface, respectively, after performing the third etching on the conductive film layer.

2. The fabrication method according to claim 1, wherein providing the silicon layer substrate further comprises sequentially polishing and cleaning the silicon wafer substrate.

3. The fabrication method according to claim 1, wherein the tunneling oxide layer is formed by deposition using an LPCVD method, and deposition condition comprises introduction of oxygen, a pressure of 100-1,000 Pa, a deposition temperature of 550-700° C. and a deposition time of 5-60 min.

4. The fabrication method according to claim 1, wherein the mask layer has a thickness between 30-110 nm, and the mask layer comprises a composite layer of silicon nitride and silicon oxynitride.

5. The fabrication method according to claim 1, wherein the first etching is performed using a laser process, laser is green laser or ultraviolet laser, and a pulse width is less than 100 nanoseconds.

6. The fabrication method according to claim 1, wherein the fabrication method further comprises:
    forming a second textured surface on the light receiving surface when the first textured surface is formed on the back surface; and
    sequentially forming a passivation layer and an optional anti-reflective layer on the second textured surface of the light receiving surface.

7. The fabrication method according to claim 1, wherein the fabrication method further comprises forming a second textured surface on a light receiving surface when the first textured surface is formed on the back surface, wherein the second textured surface is a pyramid textured surface, and wherein each pyramid has a width between 1-5 μm.

8. The fabrication method according to claim 1, wherein the mask layer is removed by etching with an etching solution with a solubility of 2-10% by volume ratio for 2-10 min.

9. The fabrication method according to claim 1, wherein the second etching is performed using a laser process, laser is green laser or ultraviolet laser, and a pulse width is less than 100 nanoseconds.

10. The fabrication method according to claim 1, wherein:
    the plurality of first opening regions $W_1$ each have a width of between 0.3-0.6 mm,
    the plurality of second opening regions $W_2$ each have a width of between 0.1-0.2 mm, and
    a plurality of separation regions Wg separating the plurality of second opening regions $W_2$ and the plurality of first opening regions $W_1$, wherein the plurality of separation regions Wg each have a width of between 0.1-0.3 mm.

11. The fabrication method according to claim 1, wherein:
    the tunneling oxide layer has a thickness between 1.5-2.5 nm;
    the first doped polycrystalline layer has a thickness between 50-300 nm;
    the intrinsic amorphous silicon layer has a thickness between 5-15 nm; and
    the second doped silicon crystal layer has a thickness between 5-20 nm.

12. The fabrication method according to claim 1, wherein the third etching is performed using a laser technology, laser is ultraviolet laser, and a pulse width is less than 100 nanoseconds.

13. The fabrication method according to claim 1, wherein the plurality of insulation grooves $W_1$ each have a width between 0.03-0.1 mm.

* * * * *